(12) United States Patent
Lillington

(10) Patent No.: US 6,907,083 B2
(45) Date of Patent: Jun. 14, 2005

(54) FREQUENCY ANALYSIS

(75) Inventor: John Lillington, Carisbrooke (GB)

(73) Assignee: R F Engines Limited, Isle of Wight (GB)

( * ) Notice: Subject to any disclaimer, the term of this patent is extended or adjusted under 35 U.S.C. 154(b) by 834 days.

(21) Appl. No.: 09/774,673

(22) Filed: Feb. 1, 2001

(65) Prior Publication Data

US 2001/0022811 A1 Sep. 20, 2001

(30) Foreign Application Priority Data

Feb. 28, 2000 (GB) .............................. 0004700

(51) Int. Cl.[7] .............................................. H04L 27/00
(52) U.S. Cl. ........................ 375/259; 455/130; 342/196
(58) Field of Search ................................. 375/329, 350, 375/259; 370/70, 50

(56) References Cited

U.S. PATENT DOCUMENTS

| | | | | |
|---|---|---|---|---|
| 4,412,325 A | * | 10/1983 | Molo | .......................... 370/210 |
| 4,792,943 A | * | 12/1988 | Göckler | ....................... 370/210 |
| 4,839,889 A | | 6/1989 | Gockler | |
| 5,268,905 A | | 12/1993 | Soloff et al. | |
| 5,864,800 A | * | 1/1999 | Imai et al. | ................... 704/229 |
| 5,926,783 A | * | 7/1999 | Goeckler | ..................... 702/190 |
| 5,999,575 A | * | 12/1999 | Tanaka et al. | ............... 375/329 |
| 6,104,822 A | * | 8/2000 | Melanson et al. | ........... 381/320 |
| 6,351,451 B1 | * | 2/2002 | Butash | ........................ 370/210 |

* cited by examiner

Primary Examiner—Stephen Chin
Assistant Examiner—Harry Vartanian
(74) Attorney, Agent, or Firm—Nixon & Vanderhye P.C.

(57) ABSTRACT

An apparatus for frequency content separating an input signal is disclosed. The apparatus comprises a plurality of frequency splitting stages, each stage including one or more up-converter and down-converter pairs. An up-converter and down-converter pair serves (i) to receive a complex input signal representing an input bandwidth and (ii) to output a first complex output signal representing an upper portion of the input bandwidth and a second complex output signal representing a lower portion of the input bandwidth. The upper portion and the lower portion being contiguous and together representing the input bandwidth portion.

15 Claims, 20 Drawing Sheets

CDC = Complex Down-Converter
CUC = Complex Up-Converter

Block Diagram of Tree System

Block Diagram of Tree System

Frequency Band Splitting

FIG.3 Complex Down-Converter (CDC)

Complex Up-Converter (CUC)

Block Diagram of Interleaved System

Detail of Interleavers

FIG.7 BASIC CDC(A) ARCHITECTURE

FIG.9 MODIFIED CDC(A) ARCHITECTURE

MODIFIED CUC(A) ARCHITECTURE

FIG.11 COMBINED CDC(A) & CUC(A) ARCHITECTURE

FIG. 12 BASIC ICDC(B) ARCHITECTURE

BASIC ICUC(B) ARCHITECTURE

Simplified ICDC(B), I Channel Only

FIG. 15 Simplified ICDC(B), Q Channel Only

FIG.16 Simplified ICDC(B), Combined I & Q Channels

FIG.17 Simplified ICUC(B), Combined I & Q Channels

BASIC ICDC(C) ARCHITECTURE

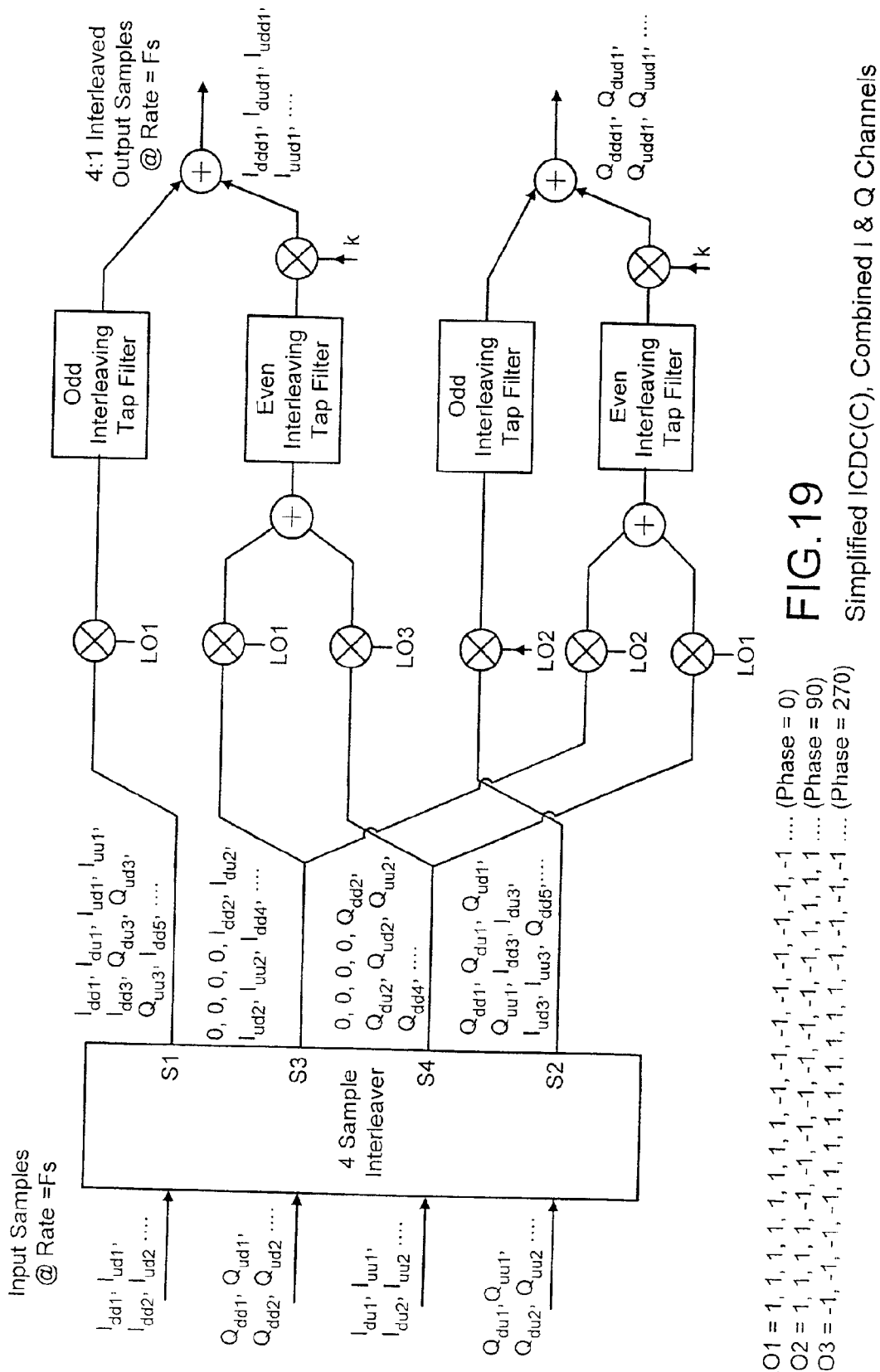
FIG.19 Simplified ICDC(C), Combined I & Q Channels

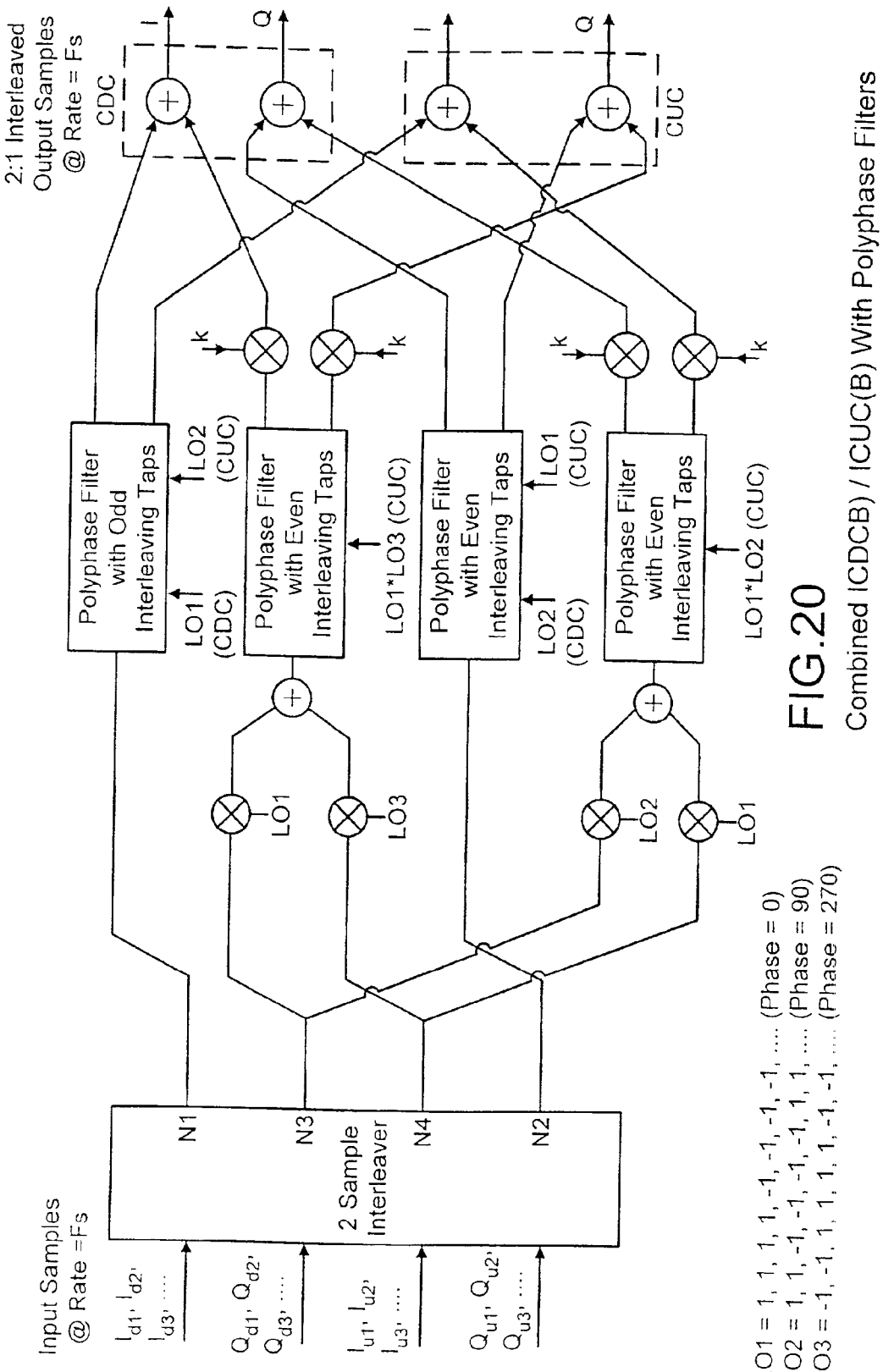
FIG.20 Combined ICDCB) / ICUC(B) With Polyphase Filters

FREQUENCY ANALYSIS

BACKGROUND OF THE INVENTION

1. Field of the Invention

This invention relates to digital signal processing (DSP) techniques for analysing the frequency content of a signal.

2. Description of the Prior Art

The most common known method employed to perform frequency analysis is the FFT (Fast Fourier Transform) method which has embodiments in both software algorithms and in hardware form. The FFT approach suffers from the disadvantage that it is better suited to software implementations rather than hardware and that it is difficult to realise a flat frequency response across a "bin" whilst maintaining good cut-off of adjacent frequency "bins".

A multistage frequency separating circuit for use in frequency separating a simple signal is described in British Published Patent Application GB-A-2 258 963. There are significant differences, however, between this circuit and the present invention. The above circuit uses successive stages of low-pass and high-pass filters to separate the signal into a number of frequency bands whereas the present invention uses successive stages of complex up and down-converters, each stage being centered at zero frequency. This has the advantage of greatly simplifying the filters which are now all low-pass filters of virtually identical design. This, in turn, leads to further simplification by the use of massive interleaving of different data streams through a common interleaving filter. It also means that all output data for each frequency "bin" is based on zero centre frequency (which is similar to the FFT output) rather than at an offset frequency which is the case for the above circuit.

SUMMARY OF THE INVENTION

Viewed from one aspect the invention provides apparatus for frequency content separating an input signal, said apparatus comprising a plurality of frequency splitting stages, each stage including one or more up-converter and down-converter pairs, an up-converter and down-converter pair serving to receive a complex input signal representing an input bandwidth and to output a first complex output signal representing an upper portion of said input bandwidth and a second complex output signal representing a lower portion of said input bandwidth, said first portion and said second portion being contiguous and together representing said input bandwidth portion.

In one form, the invention may be embodied as a "tree" system by successively splitting the frequency band of interest into two separate contiguous bands, each one being centered on zero frequency (zero IF). This is achieved by using complex up and down-converters. However, for resolution into a useful number of bands, a large number of complex converters is required (e.g for 1024 bands, we would need 2046 converters). This is a disadvantage.

In order to allow the same result to be achieved with far fewer converters, preferred embodiments of the invention interleave the samples from the upper and lower portion at each stage and passing them through a modified form of up/down-converter in the next stage. In general, this requires only $2*\text{Log}_2$ (N) stages where N equals the final number of frequency bands. For example, 1024 bands would now require only 10 converters, compared with the 2046 mentioned above for the "tree" system above.

This technique is practicable and has a similar economy of scale as the FFT has over the more direct DFT (Discrete Fourier Transform) methods.

It will be appreciated that the frequency span of the different signals within the frequency separating system could vary. However, signal processing loads are equalised and circuitry simplified when the input signal spans a range of −F to +F and the first and second complex output signals span a frequency range of −F/2 to +F/2.

In order to prevent a disadvantageous increase in the volume of data that is required to be processed as the input signal is split into multiple separated signals, preferred embodiments act to decimate the separated signals to reduce their sample rate, preferably such that the overall sample rate at each stage remains substantially constant.

The ability to interleave samples representing different portions of the frequency spectrum and effectively separately process them is facilitated in preferred embodiments that use finite impulse response filters within the up-converters and the down-converters. Within such finite impulse response filters, additional latching or delay stages can be provided between each tap point to effectively provide buffering within the data stream that takes account of the interleaved nature of the data.

The up-converters and the down-converters include a local oscillator generating coefficient signals by which the sample signals are multiplied in order to effect complex frequency separation. Preferred embodiments are advantageously simplified when the coefficient signals are constrained to a predetermined set of values, such that they may effectively be read from a lookup table or otherwise generated without the need for a true oscillator circuit.

The circuits may be further simplified when the coefficient signals are constrained to have values of −1, 0 and +1. With this constraint, the multiplication functionality can effectively be provided by multiplexers that consume considerably less computational or integrated circuit resources than proper multipliers.

Further savings in circuit area may be achieved by combining the up-converters and down-converters into combined frequency separating units as this allows more reuse of circuit elements that are common to the up-conversion and the down-conversion. Particularly preferred embodiments use polyphase filters.

Viewed from another aspect the present invention provides a method of frequency content separating an input signal, said method comprising the step of:

(i) frequency splitting a complex input signal using a plurality of frequency splitting stages, each stage including one or more up-converter and down-converter pairs, an up-converter and down-converter pair serving to receive said complex input signal representing an input bandwidth and to output a first complex output signal representing an upper portion of said input bandwidth and a second complex output signal representing a lower portion of said input bandwidth, said first portion and said second portion being contiguous and together representing said input bandwidth portion.

The above, and other objects, features and advantages of this invention will be apparent from the following detailed description of illustrative embodiments which is to be read in connection with the accompanying drawings.

BRIEF DESCRIPTION OF THE DRAWINGS

FIG. 19 illustrates a simplified interleaving complex down-converter generating combined I and Q channels; and FIG. 20 illustrates a combined interleaving complex down-converter and up-converter using polyphase filters.

DESCRIPTION OF THE PREFERRED EMBODIMENTS

Figure 1:
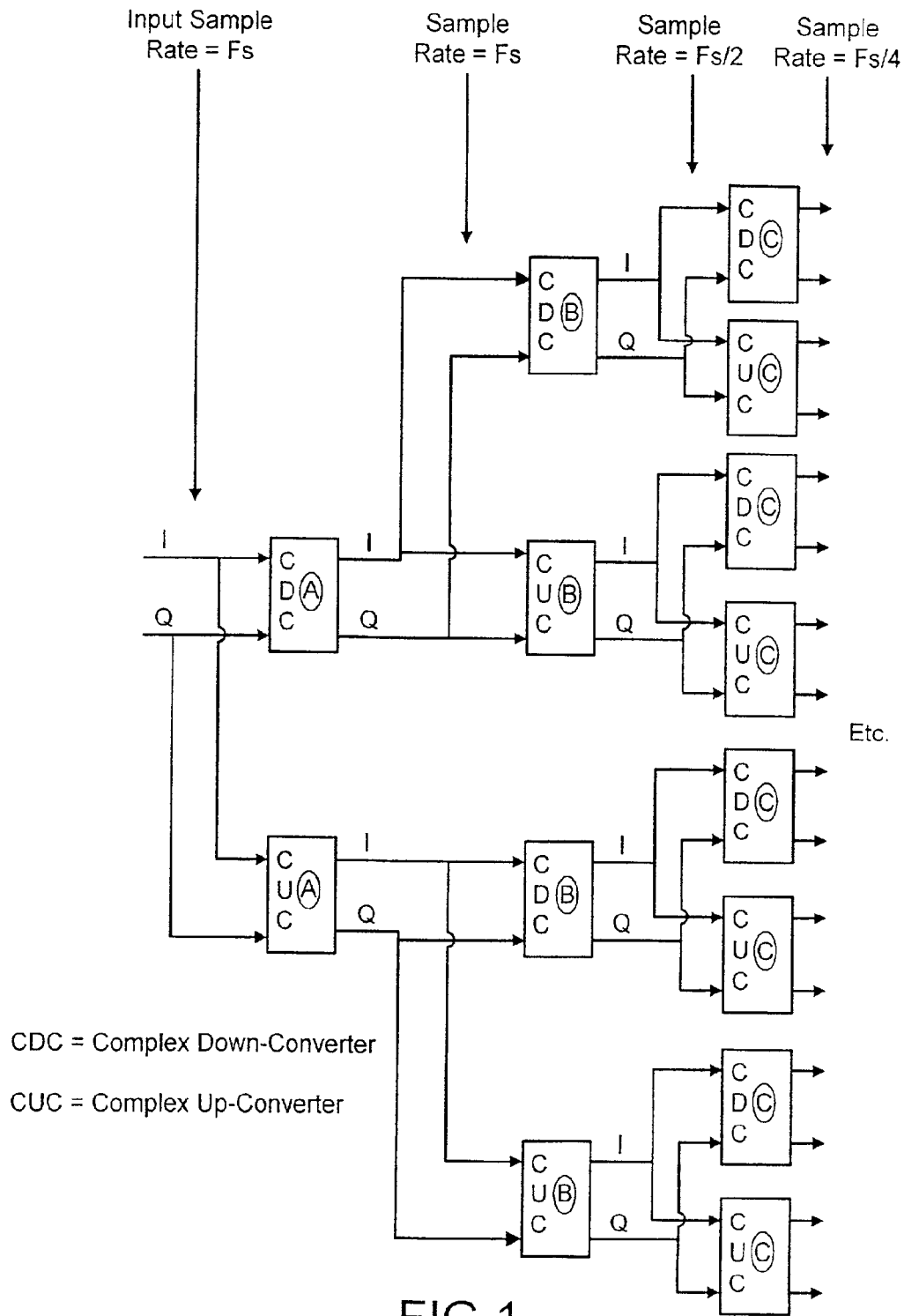
FIG. 1 is a block diagram of a tree system.
Figure 2:
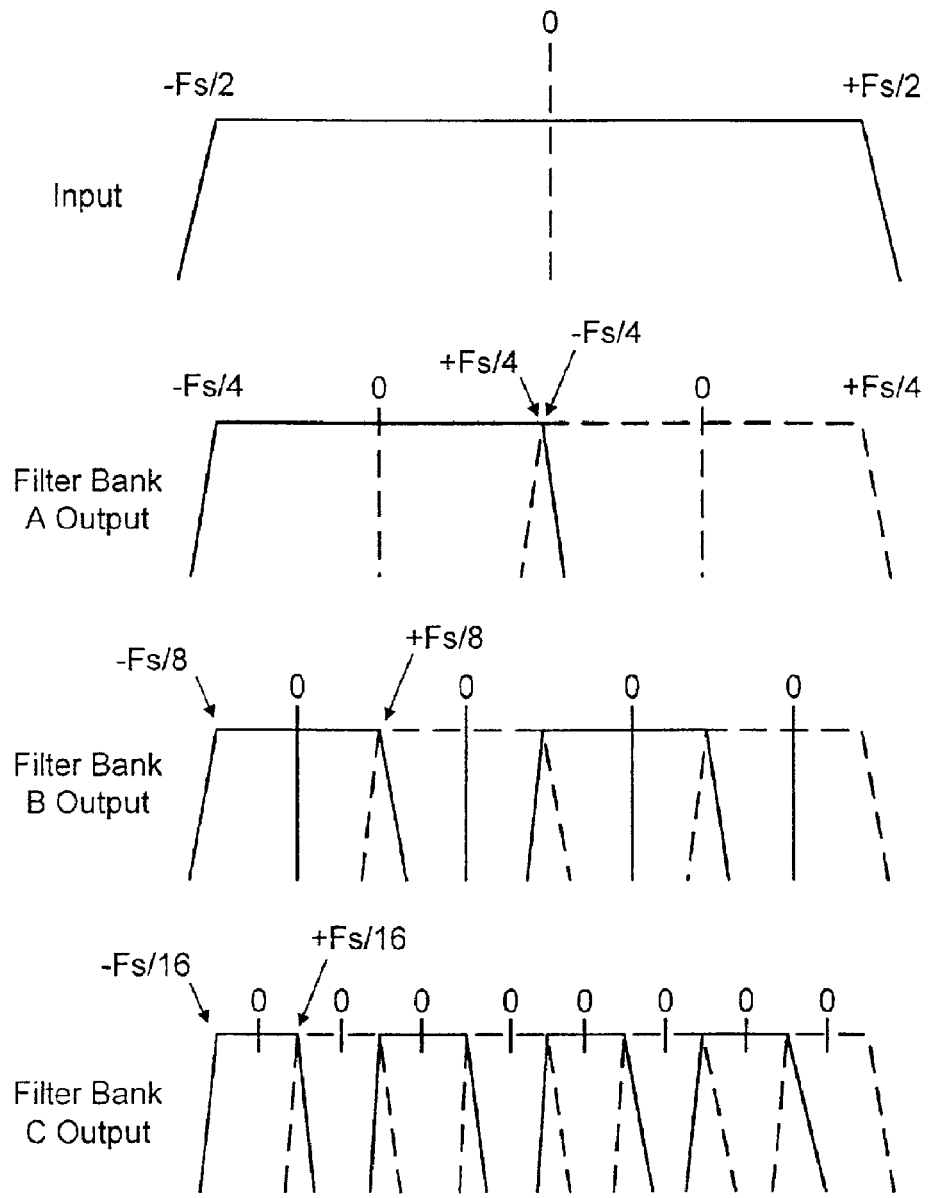
FIG. 2 illustrates frequency band splitting.

FIG. 1 gives a simplified block diagram of a 3 stage tree system. The input to the system is a band limited signal, centered on zero frequency (or zero IF). The sample rate is $F_s$ and, by using a complex (I&Q) form, the input band can occupy from $-F_s/2$ to $+F_s/2$, as illustrated in FIG. 2. The input is now split into two bands by using a Complex Down-Converter (CDC) and a Complex Up-Converter (CUC). Thus, in FIG. 2, the upper half of the input band (i.e. 0 to $+F_s/2$) is down-converted to the band $-F_s/4$ to $+F_s/4$. Similarly, the lower half of the input band is up-converted to the band $-F_s/4$ to $+F_s/4$. To avoid aliassing problems due to the finite cut-off rate of practical filters, the sample rate at the output of the first stage is maintained at $F_s$ rather than $F_s/2$. For all subsequent stages, the output sample rate may be decimated by two.

Figure 3:
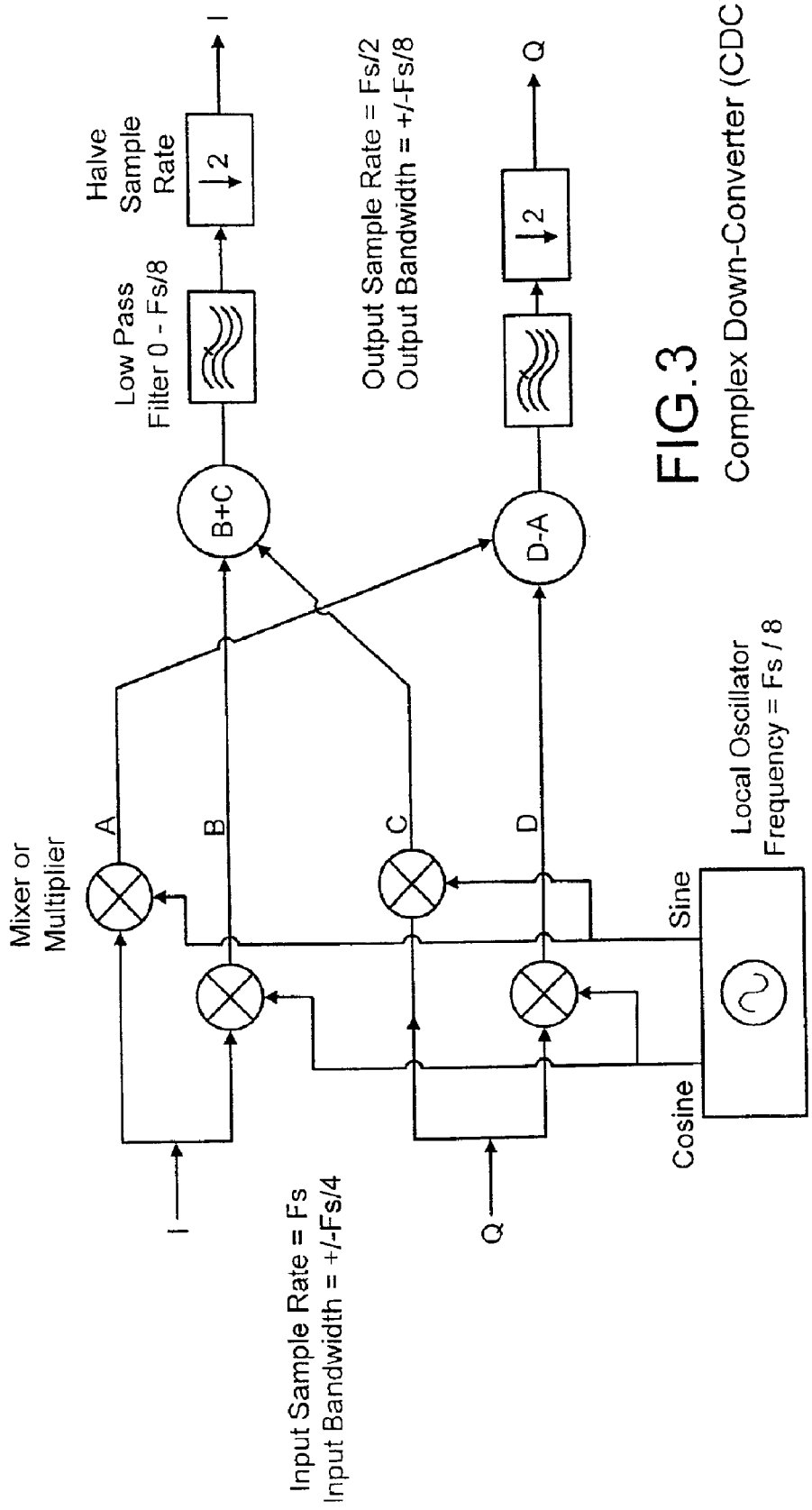
FIGS. 3 and 4 illustrate a complex down-converter and a complex up-converter.
Figure 4:
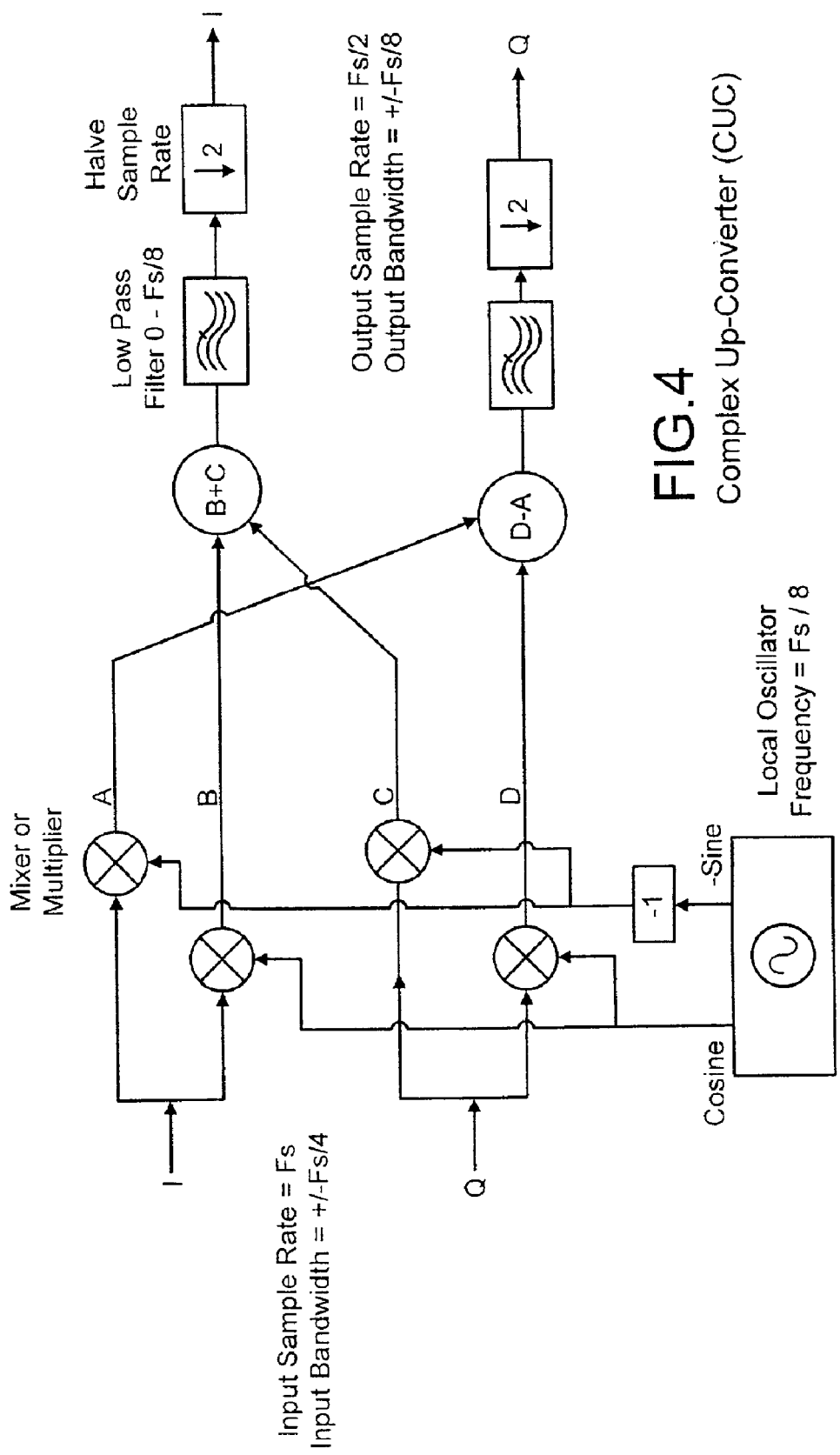

An embodiment of a complex down-converter (CDC) is shown in FIG. 3 and an embodiment of a complex up-converter (CUC) in FIG. 4 These are intended to show the principle of operation only. The preferred embodiment can be much simplified since the Sine and Cosine need only take one of five values (0, +1, −1, +0.707 and −0.707).

Figure 5:
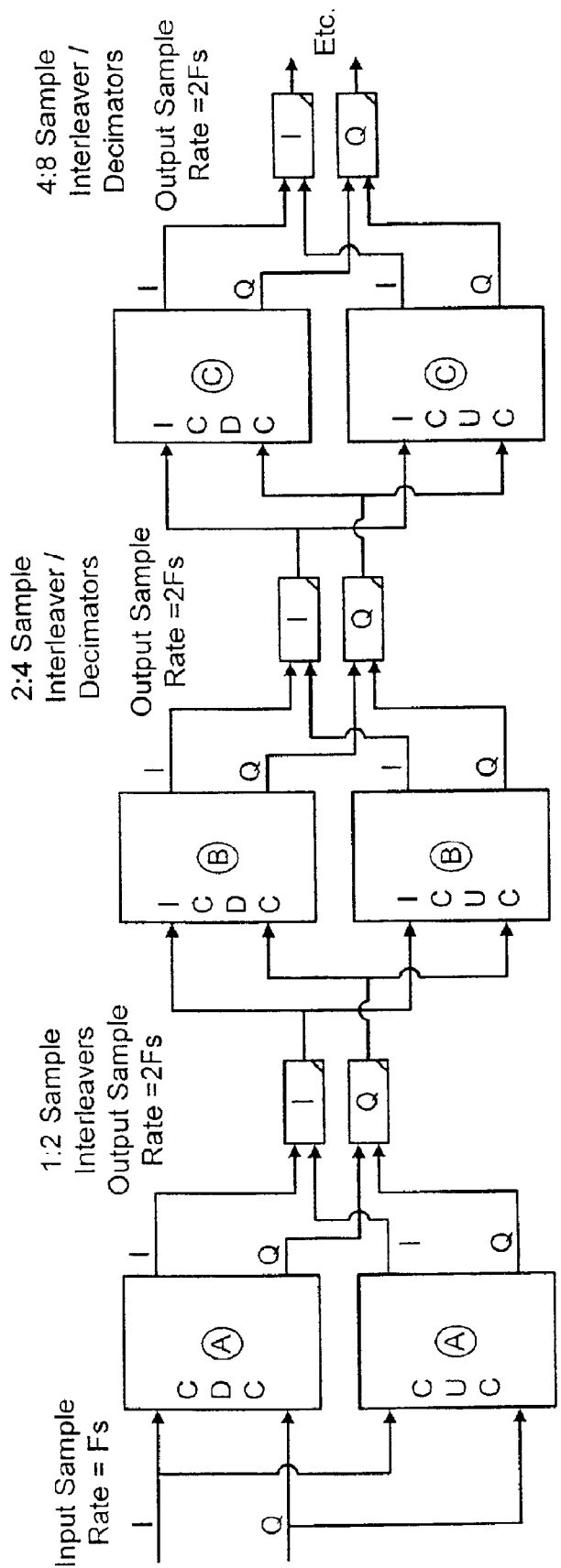
FIG. 5 is a block diagram of an interleaved system.

An overall block diagram of a system using interleaving between stages is shown in FIG. 5. The first pair of converters (CDC 'A' and CUC 'A') are identical with those of the "tree" system (FIG. 1). Thereafter, however, the samples for the 'I' channel and for the 'Q' channel are interleaved before passing to the next stage of processing.

The Interleaved Complex Down-Converter (ICDC) differs from the CDC of the "tree" system in that the Low Pass Filters are now of a special form, typically known as "Interpolating FIR Filters". By adding additional delay between the taps of a FIR (Finite Impulse Response) filter, it is possible to process any number of independent data streams by first interleaving them. The filtered output data is also interleaved in the same manner. The requirements in this embodiment are that each of the independent data streams needs to processed by an identical filter and that the Interpolating FIR filter is capable of running at the increased sample rate caused by interleaving the input data. Since each of the CDC's of the "Tree" system in any one filter bank are identical, the first requirement is met. Also, although the number of independent sample streams increases by a factor of two at each branch of the tree, the sample rate also drops by a factor of two. Thus it is possible to interleave the samples without any overall increase in sample rate, thus satisfying the second requirement above.

Exactly the same arguments apply to the Interleaved Complex Up-Converter (ICUC). The final output of the interleaved system is identical with that of the "Tree" system except that, of course, the "Tree" system outputs are in parallel form whereas the "Interleaved" system outputs are in serial form.

Figure 6:
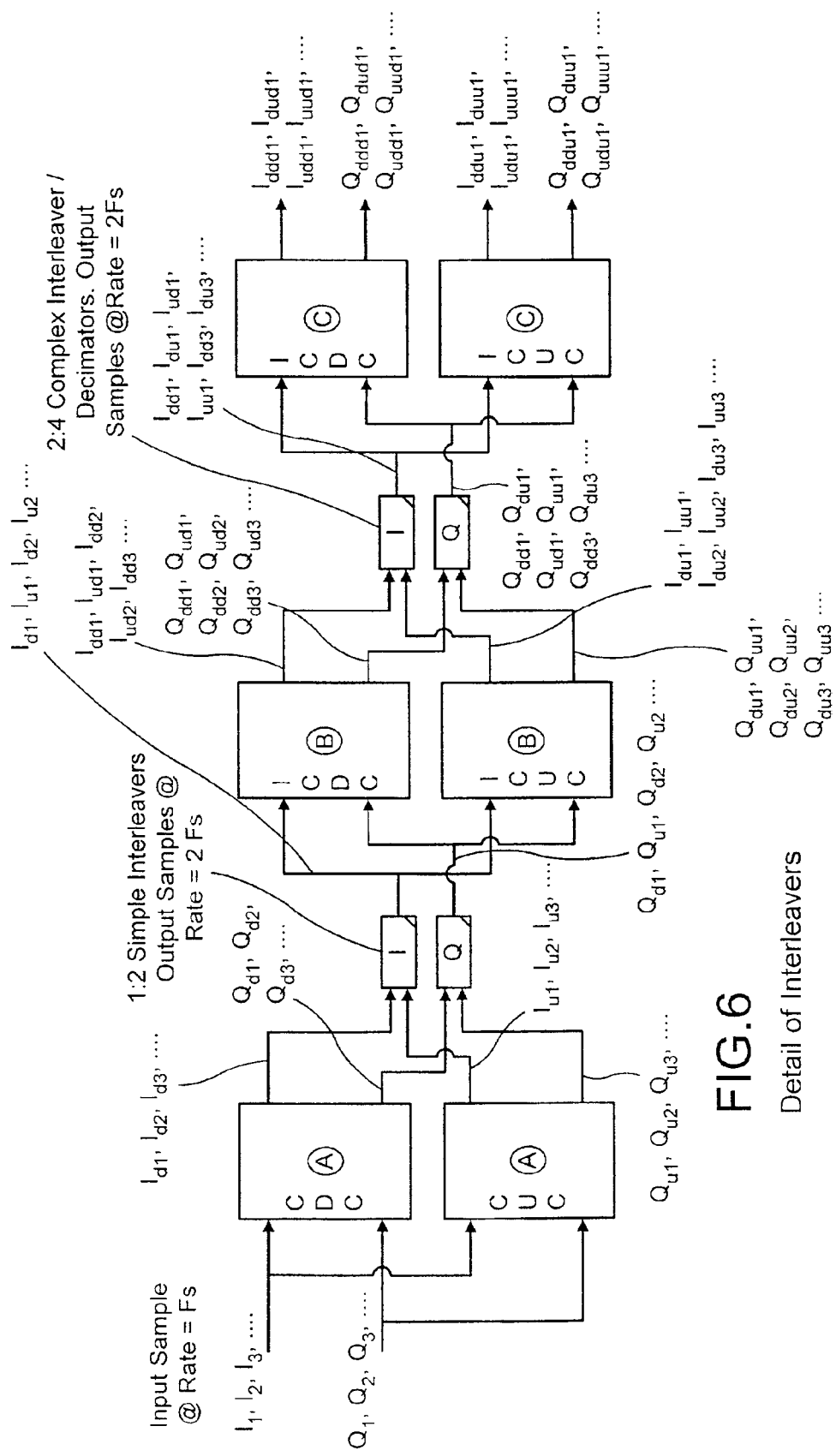
FIG. 6 shows more detail of interleavers.

Further details of the interleaving and decimation process are as follows. Referring to FIGS. 5 and 6, the complex stream of input samples to CDC(A) and CUC(A) are designated $I_1, I_2, I_3, \ldots$ etc. and $Q_1, Q_2, Q_3, \ldots$ etc. at a sample rate of $F_s$. The output of the Complex Down-Converter (CDC(A)) is the filtered sample stream, designated $I_{d1}, I_{d2}, I_{d3}, \ldots$ etc. and $Q_{d1}, Q_{d2}, Q_{d3}, \ldots$ etc. and the corresponding output from the Complex Up-Converter (CUC(A)) is the filtered sample stream, designated $I_{u1}, I_{u2}, I_{u3}, \ldots$ etc. and $Q_{u1}, Q_{u2}, Q_{u3}, \ldots$ etc. These output sample streams are also at a sample rate of $F_s$.

A pair of simple interleavers then follow which interleave the I samples, giving the stream $I_{d1}, I_{u1}, I_{d2}, I_{u2}, I_{d3}, I_{u3} \ldots$ etc. and also the Q samples giving the stream $Q_{d1}, Q_{u1}, Q_{d2}, Q_{u2}, Q_{d3}, Q_{u3} \ldots$ etc. These are now at the increased sample rate of $2F_s$.

The interleaved I and Q sample streams are then processed by the Interleaved Complex Up and Down-Converters (ICDC(B) and ICUC(B)). The complex output data stream from ICDC(B) is designated $I_{dd1}, I_{ud1}, I_{dd2}, I_{ud2}, I_{dd3}, I_{ud3}, \ldots$ Etc. and $Q_{dd1}, Q_{ud2}, Q_{dd2}, Q_{ud2}, Q_{dd3}, Q_{ud3}, \ldots$ Etc. The complex output data stream from ICUC(B) is designated $I_{du1}, I_{uu1}, I_{du2}, I_{uu2}, I_{du3}, I_{uu3}, \ldots$ Etc. and $Q_{du1}, Q_{uu1}, Q_{du2}, Q_{uu2}, Q_{du3}, Q_{uu3}, \ldots$ Etc. The sample rate at this point is still $2F_s$ which is twice the necessary rate. It is not possible, however, to simply decimate the samples by a factor of two (i.e. to remove every other sample) because of the interleaved nature of the samples. Instead, it is necessary to accept the first and second sample of each stream, remove the third and fourth, accept the fifth and sixth sample and so on before interleaving. This yields sample streams at the output of the 2:4 Complex Interleaver/Decimator as follows:

$I_{dd1}, I_{du1}, I_{ud1}, I_{uu1}, I_{dd3}, I_{du3}, \ldots$ Etc. and $Q_{dd1}, Q_{du1}, Q_{ud1}, Q_{uu1}, Q_{dd3}, Q_{du3}, \ldots$ Etc.

For any subsequent stages, the interleaver/decimator principle is the same. For example, the following stage would retain samples 1, 2, 3 and 4, discard samples 5, 6, 7 and 8, retain samples 9, 10, 11 and 12 (etc.) before interleaving. The next stage would retain samples 1 to 8, discard samples 9 to 16 and so on. The implementation of this process can be carried out in various ways including, for example, switched FIFO (first in first out) memory with the read rate set to half the write rate.

This further detailed information building upon the above is given below. Firstly, there is described how the basic CDC(A) and CUC(A) architectures can be simplified and combined into a common structure thereby giving a considerable saving in processing power. Secondly, there is described how a similar simplification and combination can be applied to to the next stage ICDC(B)/ICUC(B) and ICDC(C)/ICUC(C) structures. Finally it shows how even greater simplification can be achieved by employing polyphase filter structures which combine the filter and local oscillator functions.

Simplification of CDC(A) and CUC(A) Architectures.

Figure 7:
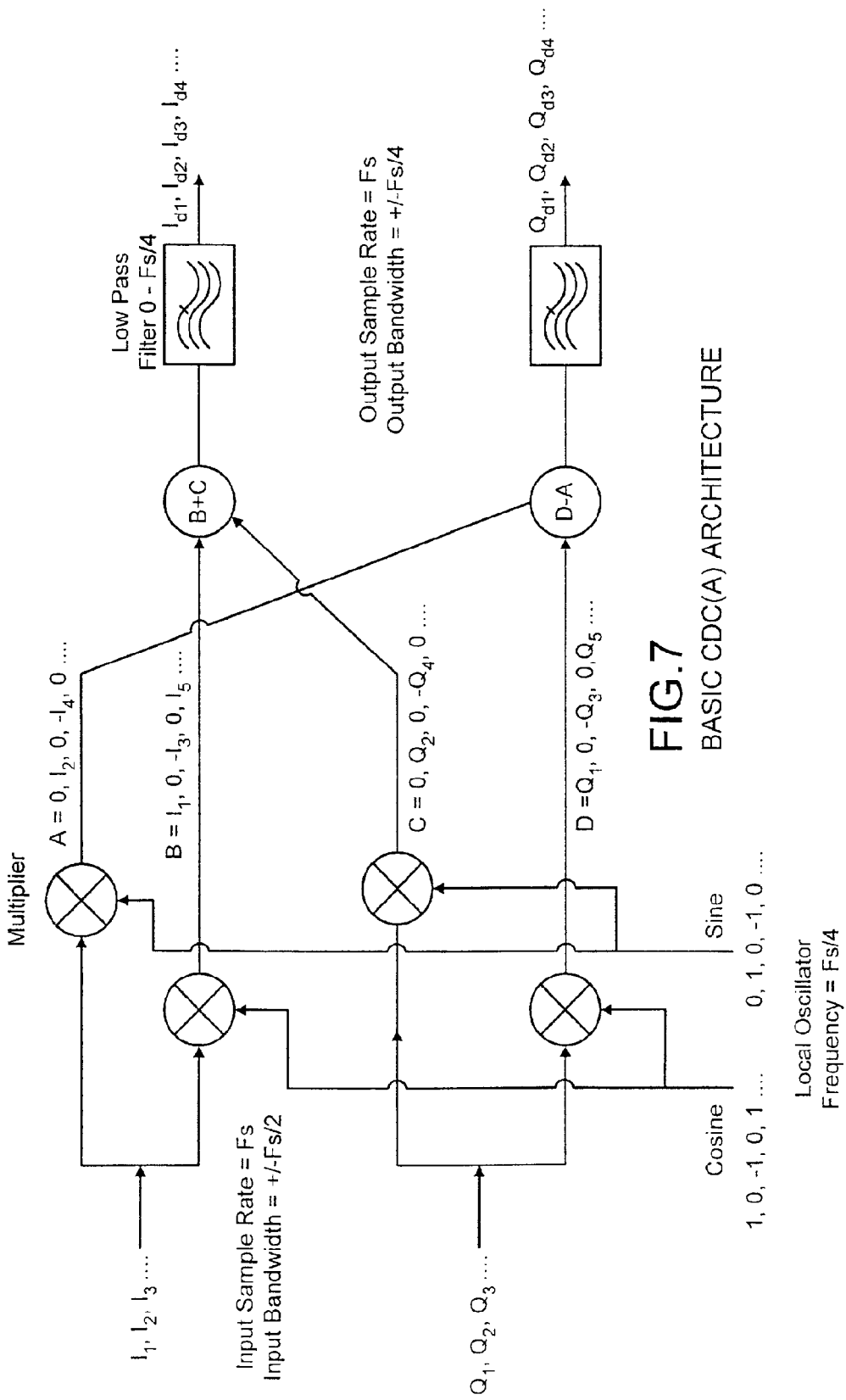
FIGS. 7 and 8 show the architecture of a basic complex down-converter and a basic complex up-converter.
Figure 8:
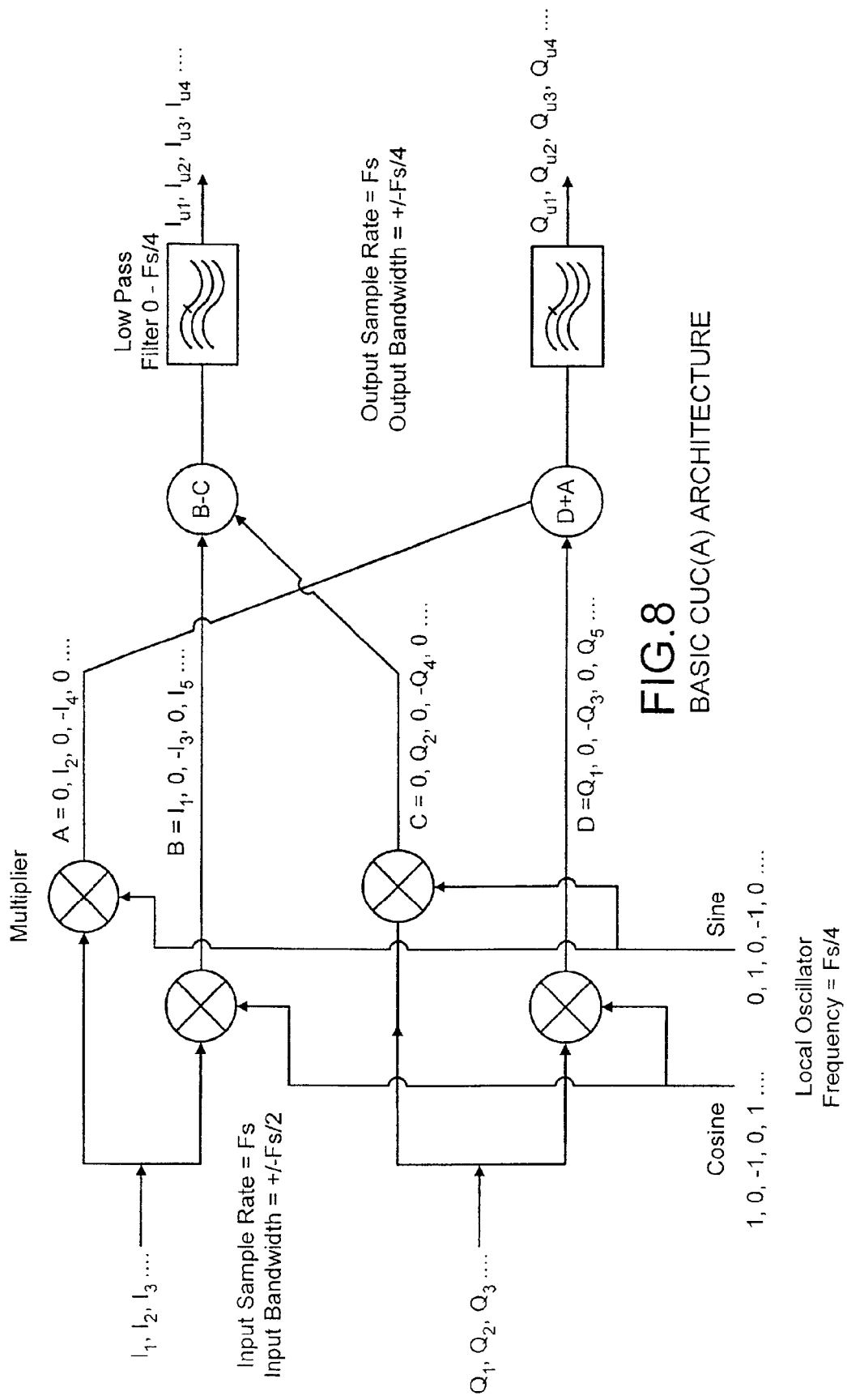
Figure 9:
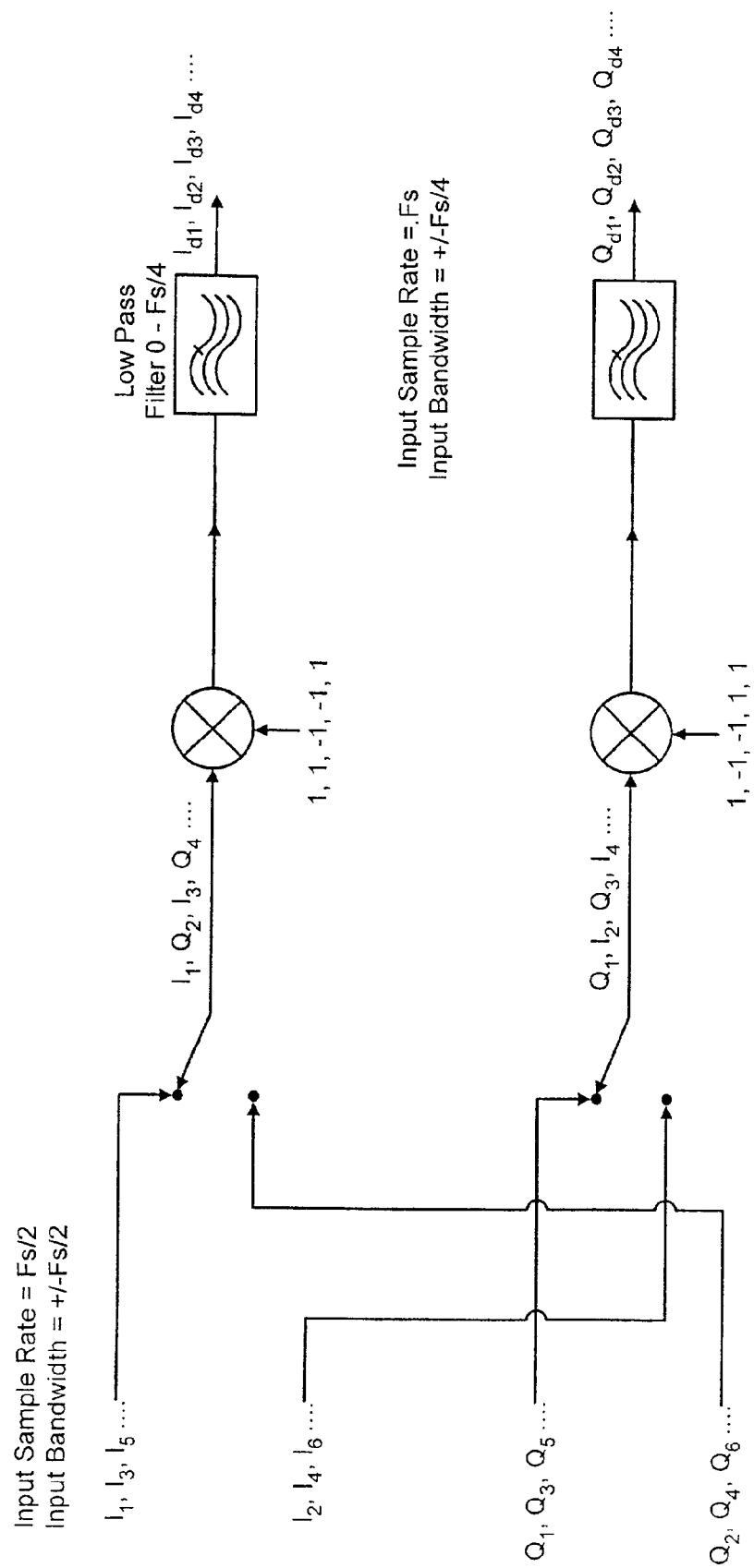
FIGS. 9 and 10 show a modification to the architecture of FIGS. 7 and 8.
Figure 10:
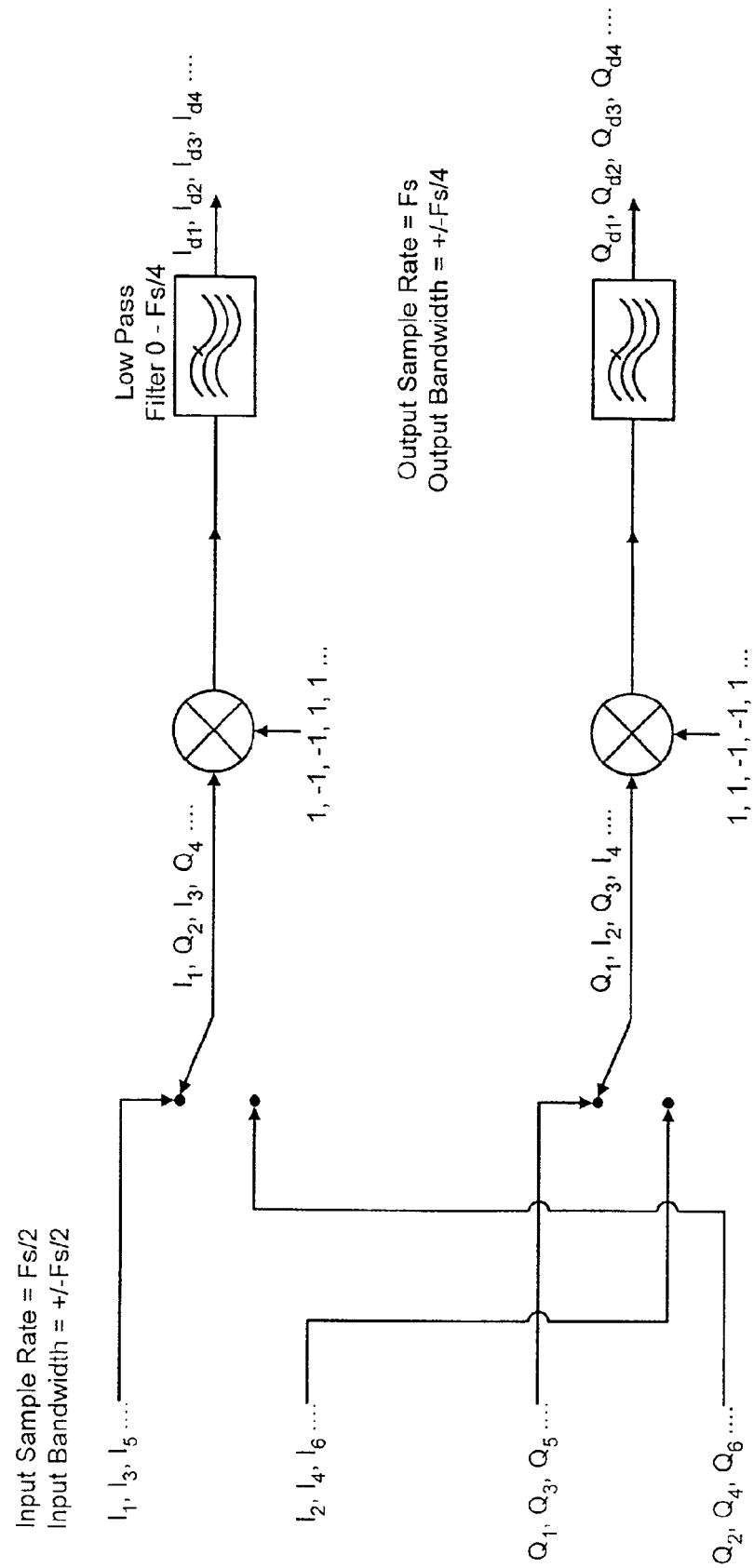

FIGS. 7 and 8 show the basic CDC(A) and CUC(A) architectures which were referred to in FIG. 6. Good use may be made of the fact that the local oscillators only take one of three values, +1, 0 or −1. In particular, there is no point in processing samples which are multiplied by zero. This allows the simplification of the CDC(A) and CUC(A) as shown in FIGS. 9 and 10 where the four original multipliers may be replaced by two switches and two multipliers. Since the two multiplier inputs are only +1 or −1, this reduces to a very simple process.

Figure 11:
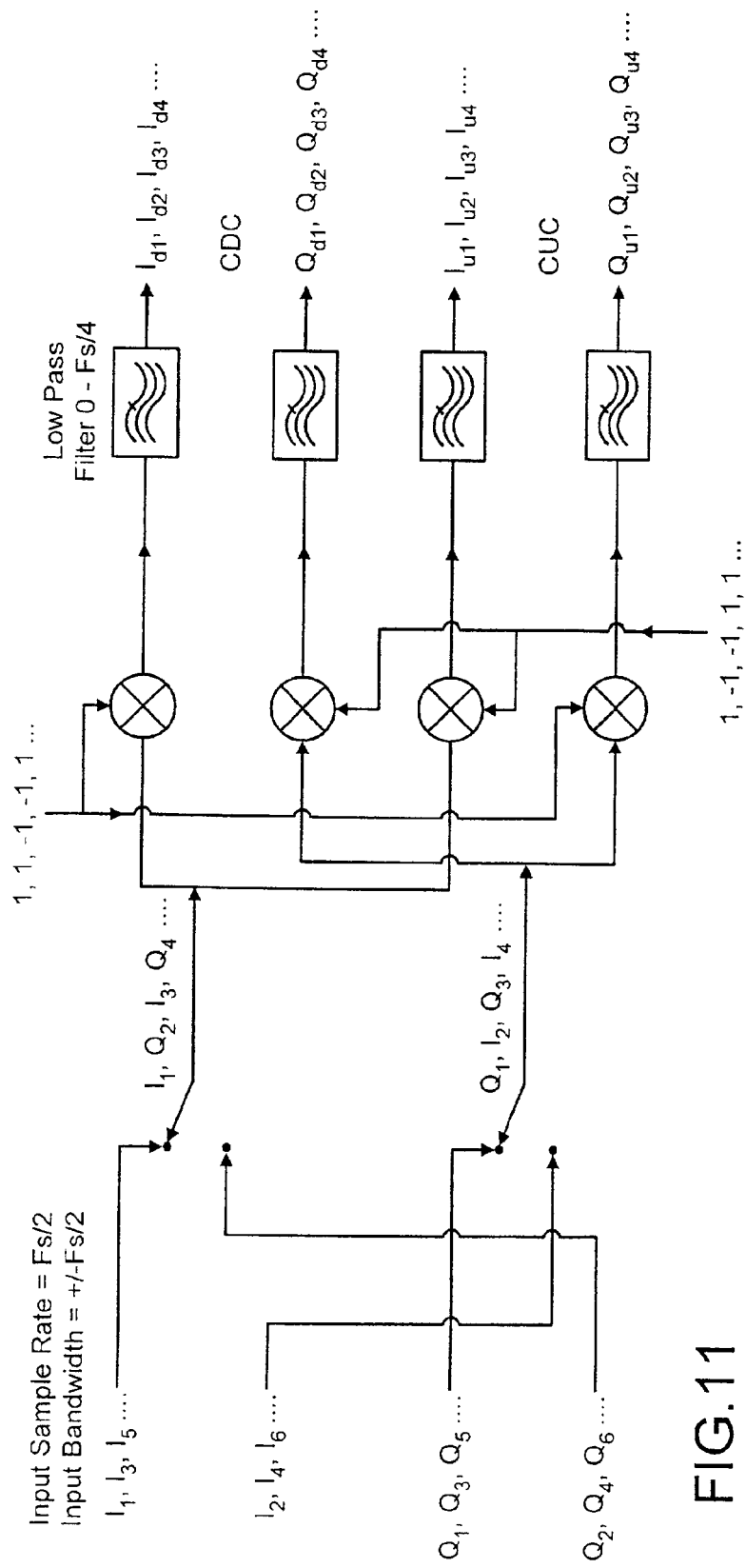
FIG. 11 shows a combined complex up-converter and complex down-converter architecture.

Further simplification may be obtained by observing that the input switching arrangements is identical in each case and can thus be combined into a common architecture as shown in FIG. 11.

Simplification of ICDC(B) and ICUC(B) Architectures.

Figure 12:
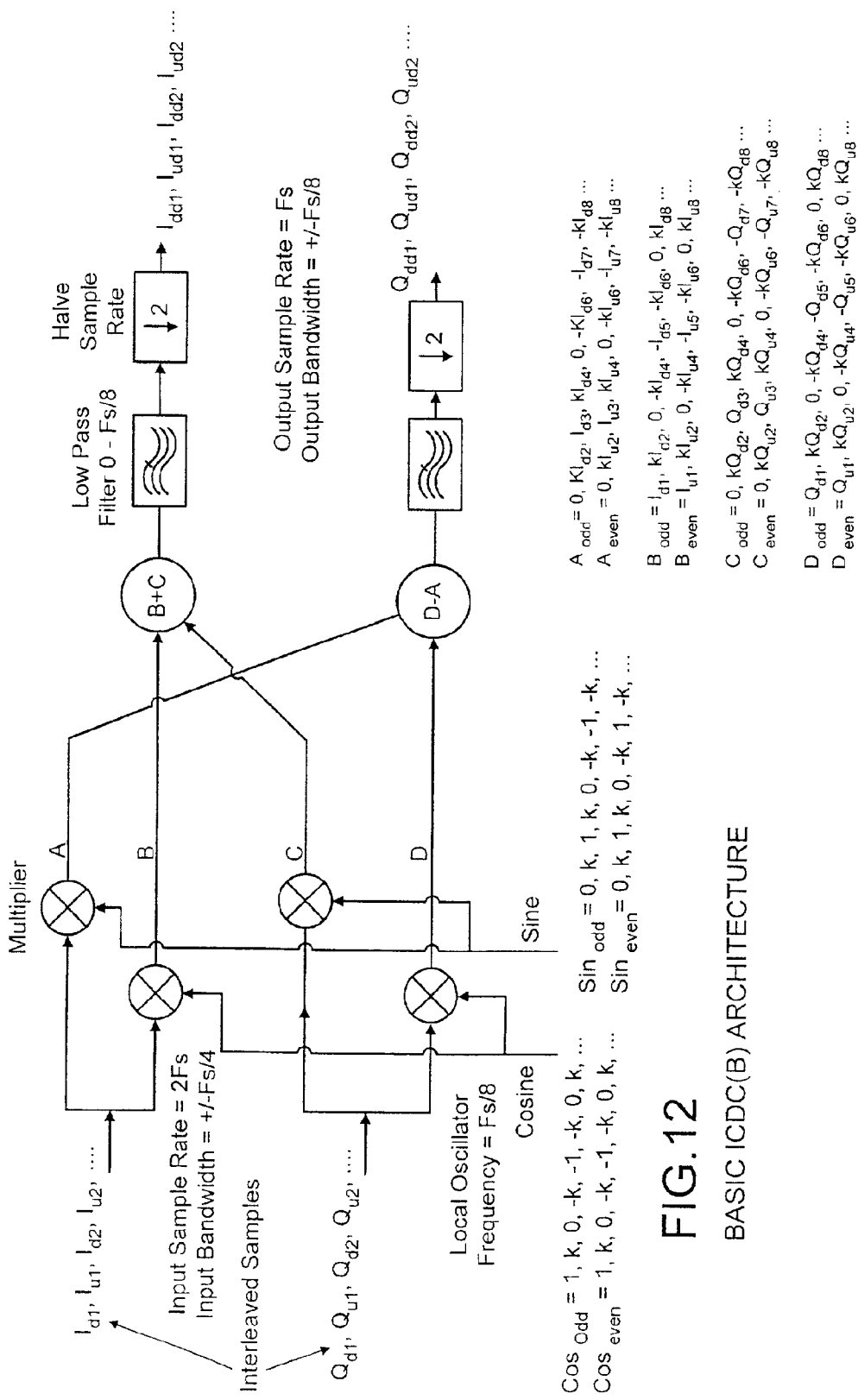
FIGS. 12 and 13 show the architecture of a basic interleaving complex down-converter and complex up-converter.
Figure 13:
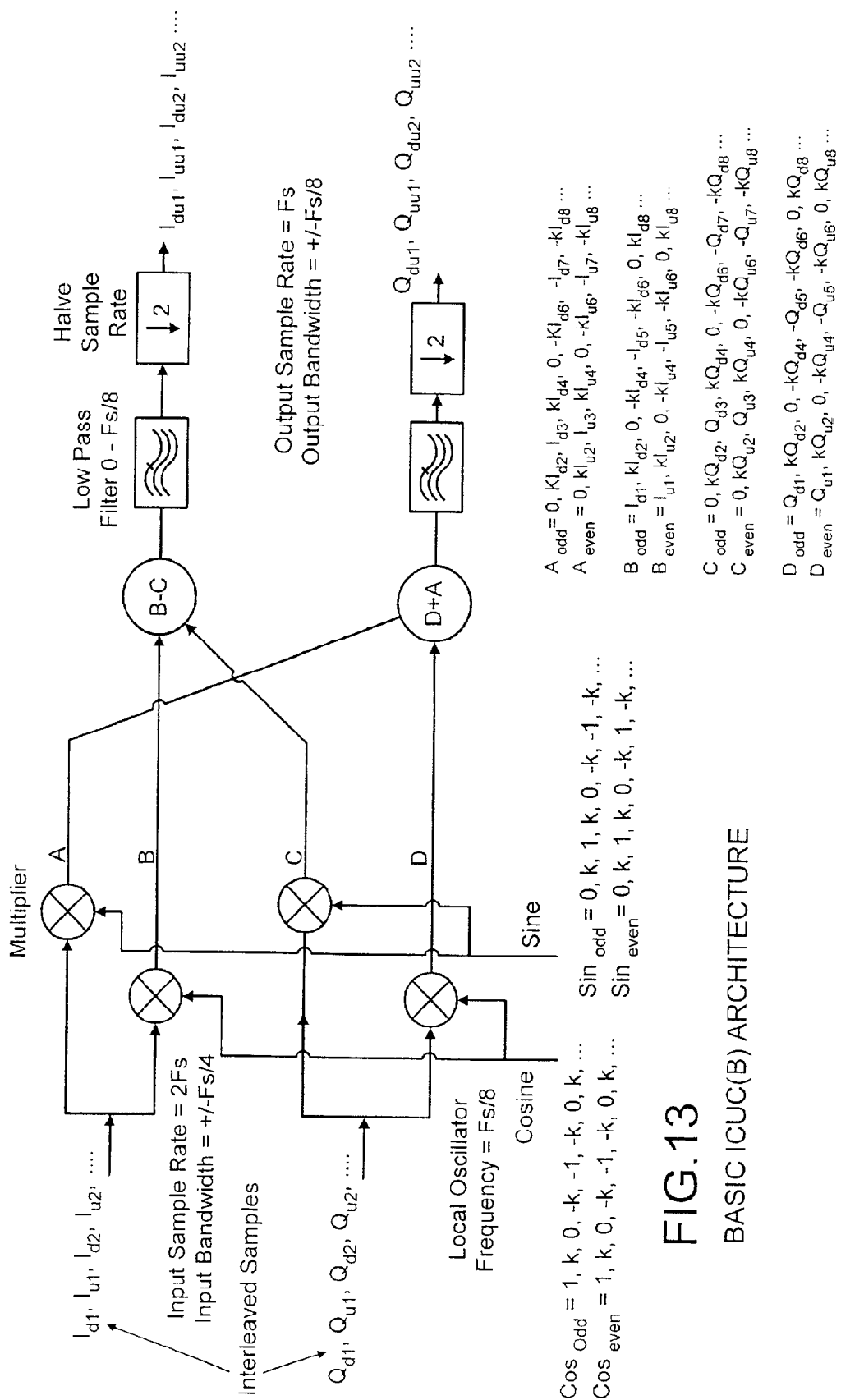

FIGS. 12 and 13 show the basic ICDC(B) and ICUC(B) architectures which are referred to in FIG. 6. The main differences from the CDC(A) and CUC(A) structures are as follows:

(a) The input samples are now 2:1 interleaved—i.e. alternate samples belong to a different sample stream.

(b) The local oscillators are more complex since they can now take one of five values, +1, +k, 0, −k or −1 where k is defined as the square root of two divided by two.

(c) The local oscillators are also 2:1 interleaved and can be considered as identical odd and even samples.

(d) The lowpass filters are now of the interleaving type—i.e. extra delays are added between the taps of the FIR (finite impulse response) filters to allow independent processing of the interleaved sample streams. This is a standard technique.

The structure can be considerably simplified. Firstly, as with the CDC(A)/CUC(A) above, avoid multiplying samples by zero. Secondly, split the sample streams into two such that one stream is multiplied by the +1, −1 element of the local oscillator and the other by the +k, −k element. The latter then reduces to a multiplication by +1, −1 followed (or preceded) by a scaling factor of k. Thirdly, the interleaving can be carried out in a more efficient way by taking the non-interleaved outputs from CDC(A)/CUC(A) and interleaving them as shown in FIG. 14.

Figure 14:
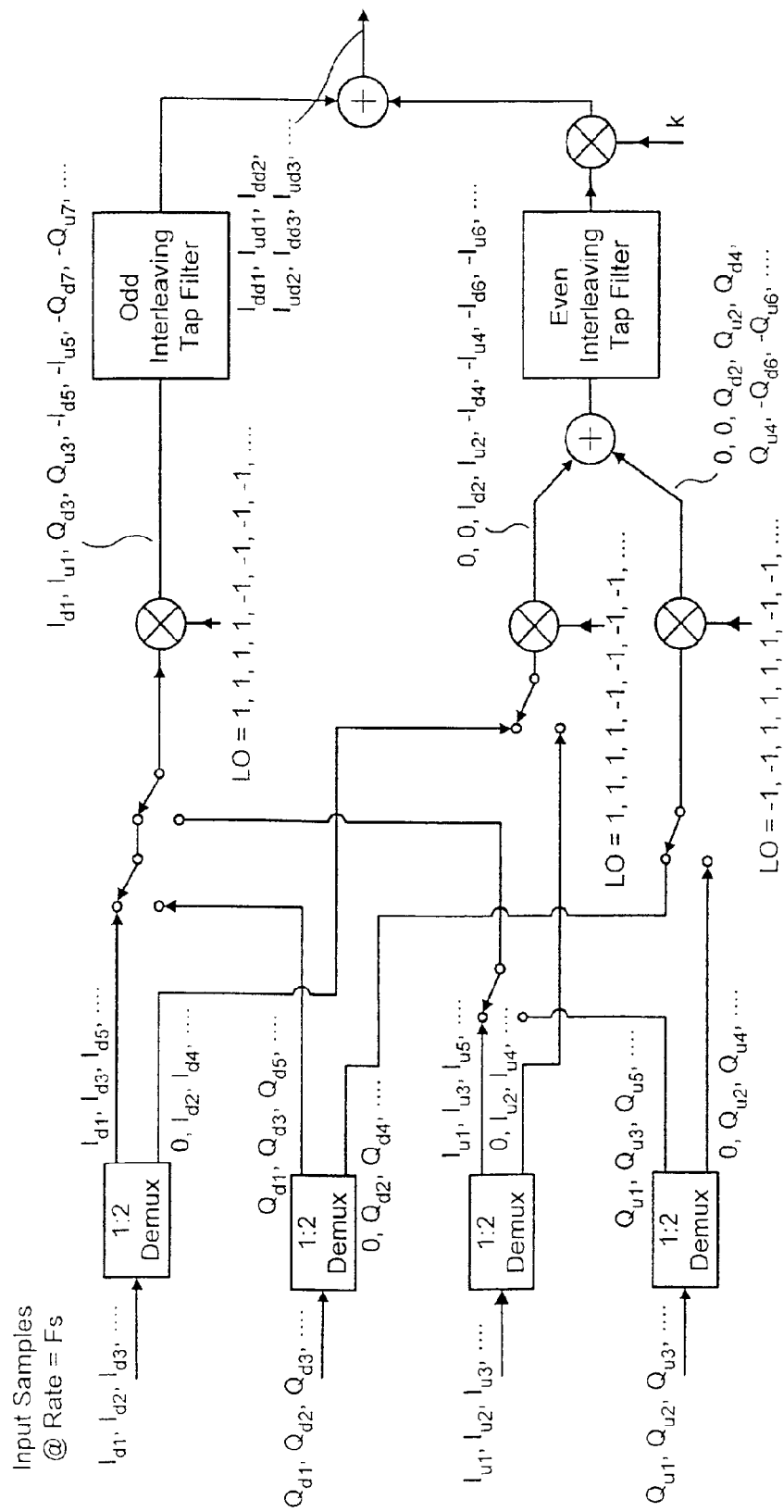
FIGS. 14 and 15 show a simplified interleaving complex down-converter generating the I and Q channels respectively.
Figure 15:
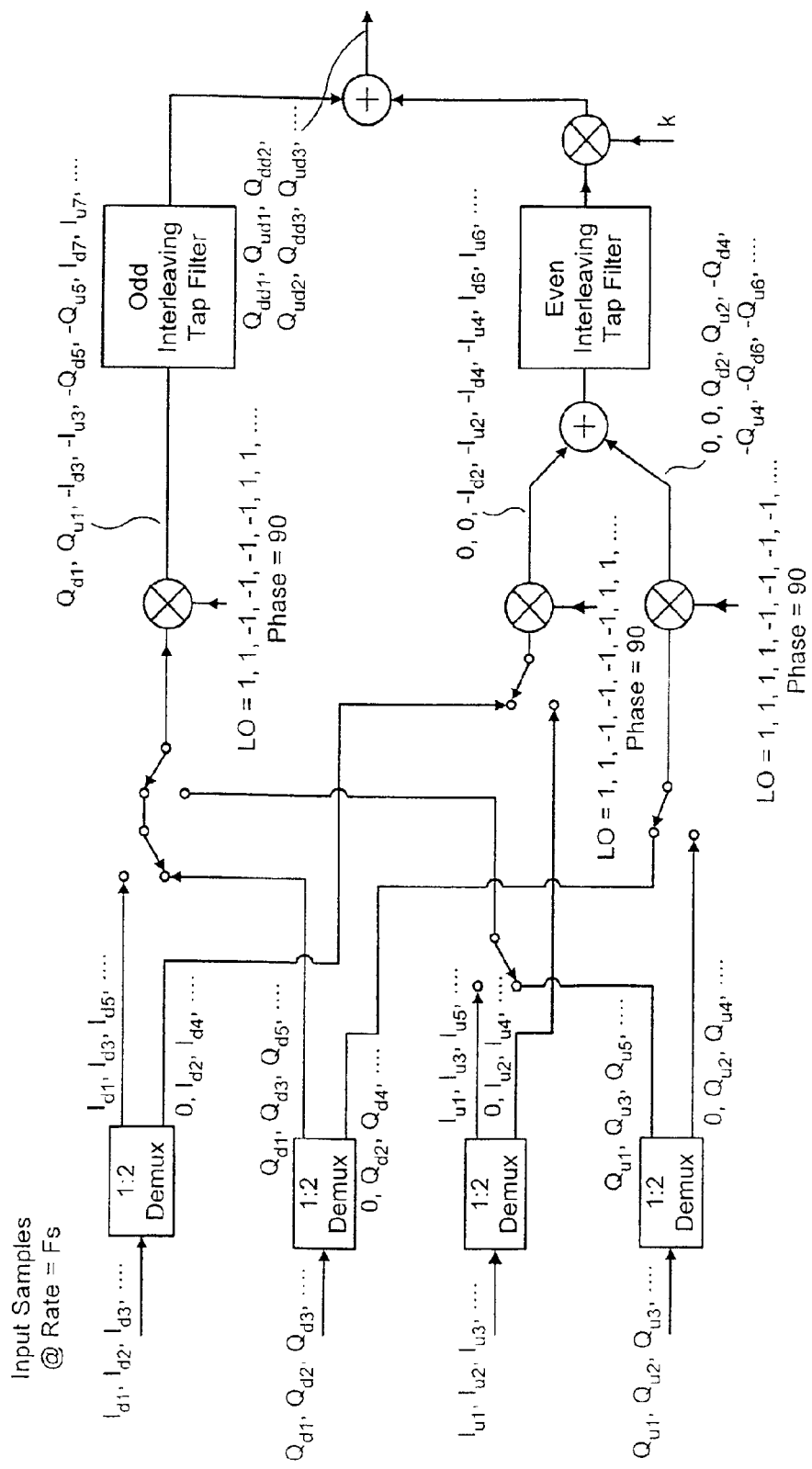
Figure 16:
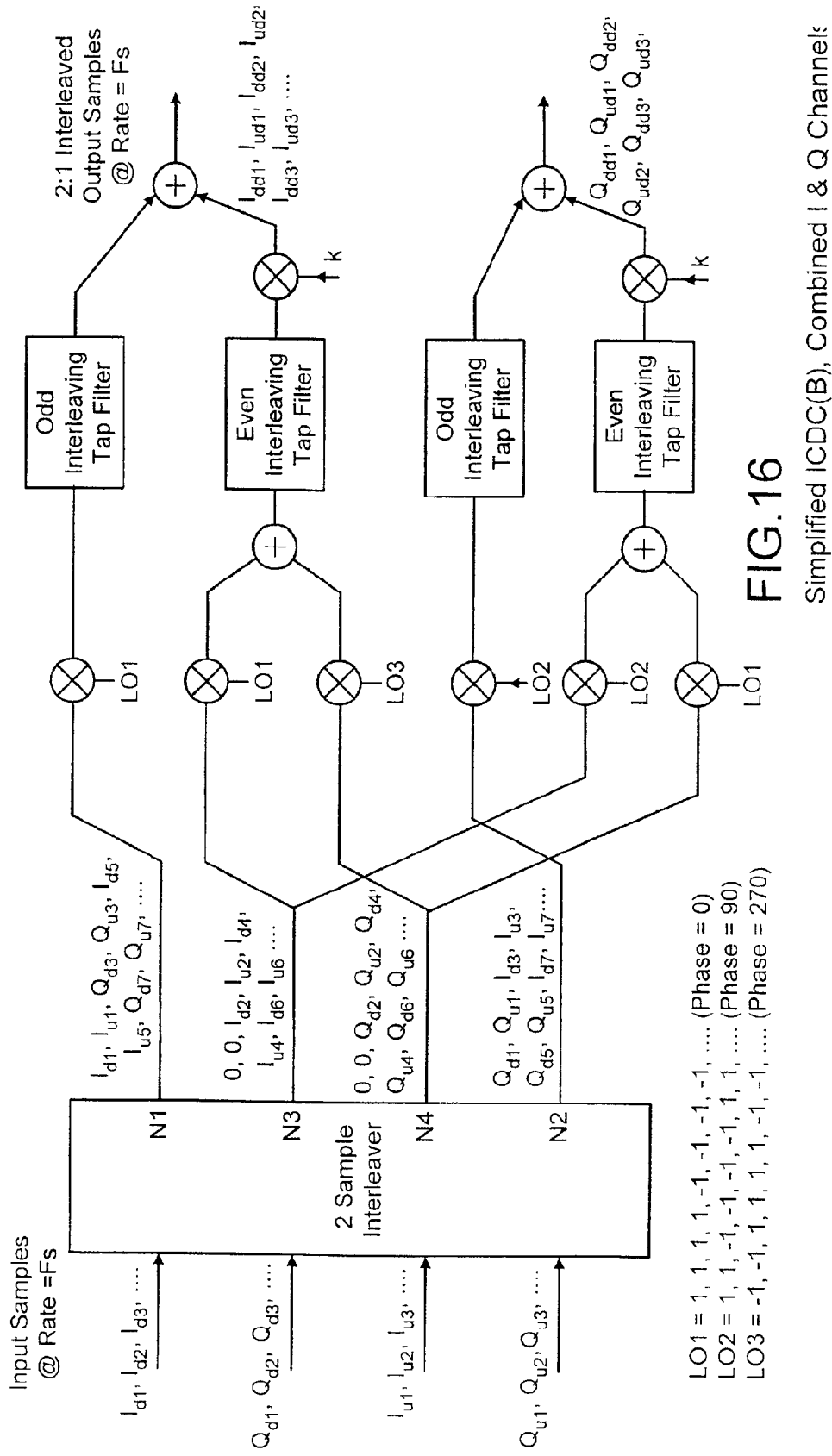
FIGS. 16 and 17 show a simplified interleaving complex down-converter and interleaving complex up-converter generating combined I and Q channels.

FIG. 14 and FIG. 15 show the simplified structures for the ICDC(B) I and Q channels respectively and the combined structure is shown in FIG. 16. At first sight this may seem to be almost as complex as the basic architecture of FIG. 12. However, the basic architecture runs at the full rate of 2Fs until the output is decimated by a factor of two (sample rate is halved). The simplified structure only needs to run at a sample rate of Fs throughout. Although there appear to be to be four filters compared with the original two filters, the new filters only contain the odd or even taps so that the total number of taps (multipliers) remains the same. The other great simplification is that the local oscillators inputs are all +1 or −1 which can be very simply realised.

Figure 17:
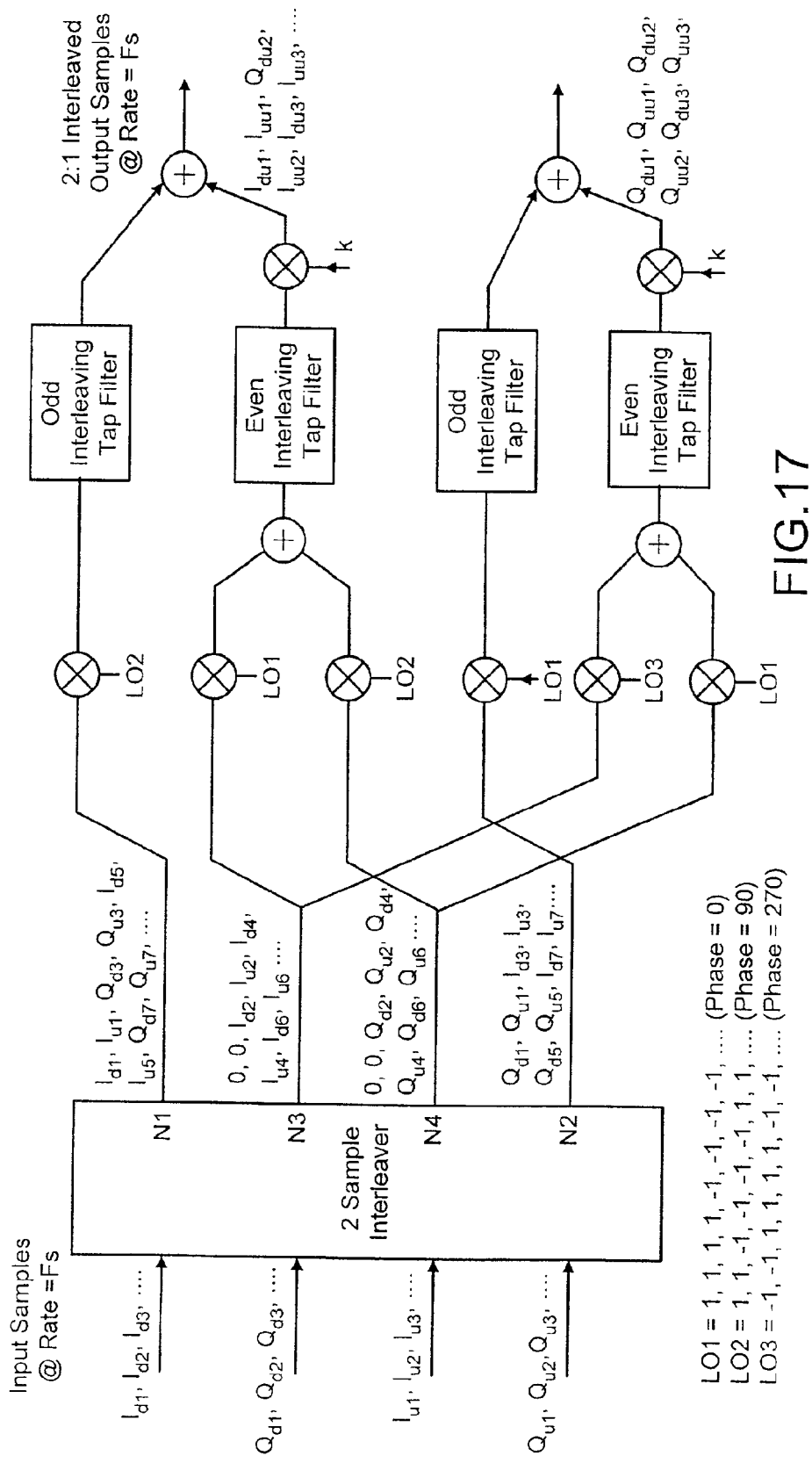

FIG. 17 shows the simplified structure for the combined ICUC(B) I and Q channels. It is exactly the same as that for the ICDC(B) except that the local oscillators have different phases. This allows the possibility of further simplification by combining the LO and filter functions into poly-phase filters. This is dealt with below.

Simplification of ICDC(C) and ICUC(C) Architectures.

Figure 18:
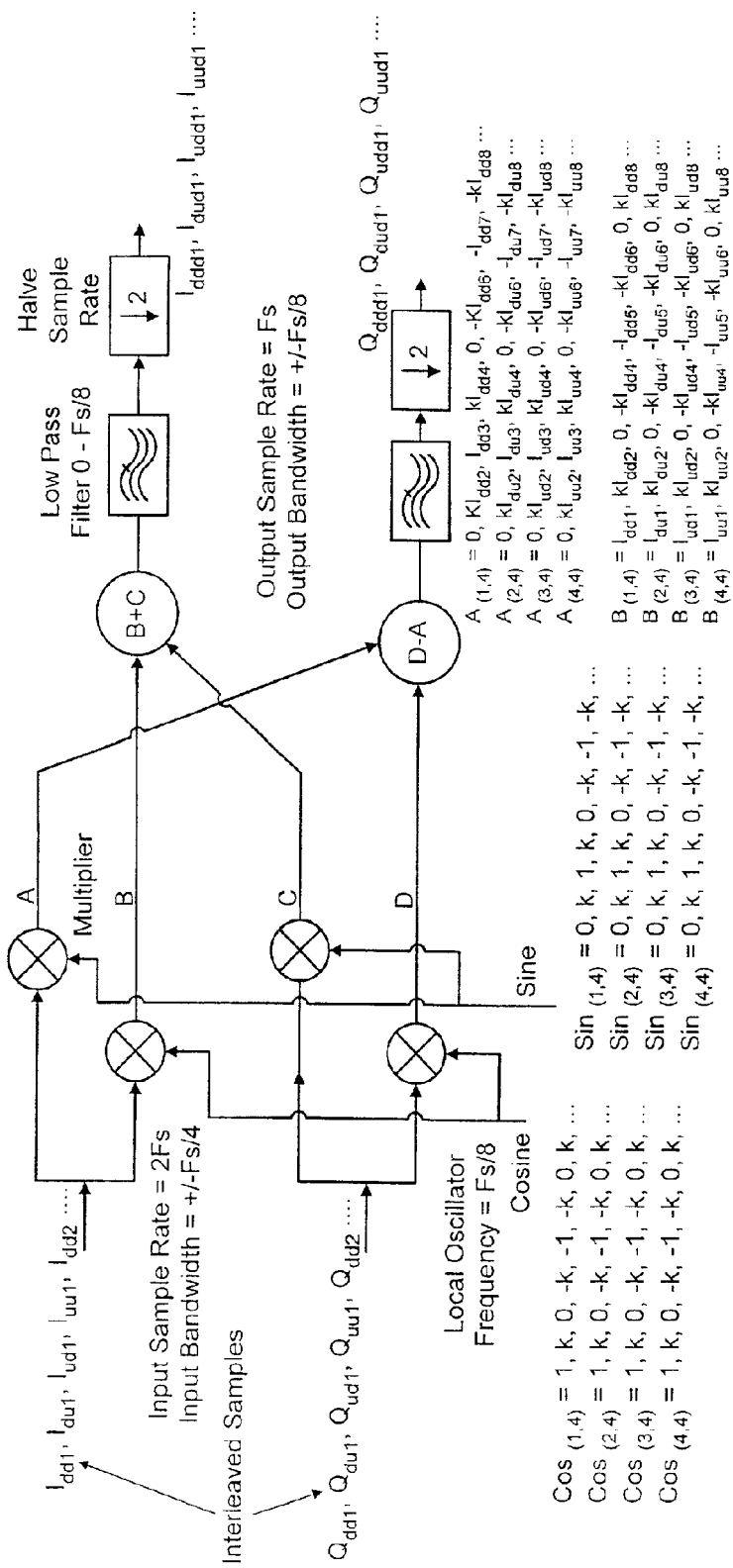
FIG. 18 illustrates a basic interleaving complex down-converter architecture.

FIGS. 18 shows the basic ICDC(C) architecture which is referred to in FIG. 6. The main differences from the ICDC (B) structures are as follows:

(a) The input samples are now 4:1 interleaved—i.e. successive samples belong to one of four different sample streams.

(b) The local oscillators are also 4:1 interleaved although the inputs still take one of five possible values, +1, +k, 0, −k and −1.

(c) The lowpass filters are still of the interleaving type but with extra delays added between the taps of the FIR (finite impulse response) filters to allow independent processing of the four interleaved sample streams.

Using similar techniques to those described for the ICDC (B)/ICUC(B) above, the architecture may be considerably simplified. The structure of FIG. 19 closely resembles that of FIG. 16 and differs only in the degree of interleaving of data samples and local oscillator samples Use of Poly-phase Filter Structures.

It may be noted that there is great similarity between the CDC and CUC structures at each stage the only difference being the phasing of the local oscillators. Polyphase filters may be used to combine the local oscillator and filter and exploit the commonality between the CDC and CUC filter tap weights. This will be illustrated by reference to the ICUC(B)/ICUC(B) architecture.

Referring to FIGS. 16 and 17 it may be seen that they are identical except for the phasing of the local oscillators. By using poly-phase filters using common input coefficient multiplication of the data but with separate local oscillator phasing of the multiplier outputs, it is possible to combine pairs of filters. Each of these filters is only slightly more complex than a single filter, requiring an additional adder chain to obtain the second output. FIG. 20 shows the overall simplified structure for the combined ICDC(B)/ICUC(B).

The same approach may be used for the ICDC(C)/ICUC (C) and all subsequent stages of the overall PFT structure, resulting in very economical processing.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Apparatus for frequency content separating an input signal, said apparatus comprising:

a plurality of frequency splitting stages, each stage including one or more up-converter and down-converter pairs, and an up-converter and down-converter pair arranged to receive a complex input signal representing an input bandwidth and to output a first complex output signal representing an upper portion of said input bandwidth and a second complex output signal representing a lower portion of said input bandwidth, said first portion and said second portion being contiguous and together representing said input bandwidth wherein between frequency splitting stages, said apparatus is arranged to combine said first complex cutout signal and said second complex cutout signal to form an interleaved complex signal for subsequent processing.

2. Apparatus as claimed in claim 1, wherein said complex input signal spans a frequency range of −F to +F wherein F is a frequency.

3. Apparatus as claimed in claim 2, wherein said first complex output signal and said second complex output signal both span a frequency range of −F/2 to +F/2.

4. Apparatus as claimed in claim 1, wherein said first complex output signal and said second complex output signal each comprise a stream of digital sample values.

5. Apparatus as claimed in claim 1, further comprising:
means for decimating each of said first complex output signal and said second complex output to reduce sample rate prior to combination to form said interleaved complex signal.

6. Apparatus as claimed in claim 5, wherein said first complex output signal and said second complex output signal each have a complex output signal sample rate and said interleaved complex signal has an interleaved signal sample rate and said interleaved complex signal has an interleaved signal sample rate substantially equal to said complex output signal sample rate.

7. Apparatus as claimed in claim 1, wherein one or more of said up-converters and said down-converters comprises a finite impulse response filter.

8. Apparatus as claimed in claim 1, wherein one or more of said up-converters and said down-converters comprises a local oscillator generating a time varying coefficient signal by which sample signals are multiplied.

9. Apparatus as claimed in claim 8, wherein said coefficient signal has a predetermined set of values.

10. Apparatus as claimed in claim 9, wherein said predetermined set of values comprises $-1, -\sqrt{2}/2, 0, +\sqrt{2}/2$ and $+1$.

11. Apparatus as claimed in claim 9, wherein said predetermined set of values comprises $-1, 0$ and $+1$.

12. Apparatus as claimed in claim 11, further comprising:
sample signal multiplexers for selecting signals for combination arranged to perform multiplication by said coefficient values.

13. Apparatus as claimed in claim 1, wherein said up-converter and said down-converter pairs are formed as a combined conversion unit with shared components.

14. Apparatus as claimed in claim 13, wherein said combined conversion unit includes a poly-phase filter.

15. A method of frequency content separating an input signal, comprising:
frequency splitting a complex input signal using a plurality of frequency splitting stages, each stage including one or more up-converter and down-converter pairs, an up-converter and down-converter pair for receiving said complex input signal representing an input bandwidth and outputting a first complex output signal representing an upper portion of said input bandwidth and a second complex output signal representing a lower portion of said input bandwidth, said first portion and said second portion being contiguous and together representing said input bandwidth, portion; and between frequency splitting stages, combining said first complex output signal and said second complex output signal to form an interleaved complex signal for subsequent processing.

* * * * *

UNITED STATES PATENT AND TRADEMARK OFFICE
CERTIFICATE OF CORRECTION

PATENT NO. : 6,907,083 B2
DATED : June 14, 2005
INVENTOR(S) : Lillington

It is certified that error appears in the above-identified patent and that said Letters Patent is hereby corrected as shown below:

Column 6,
Lines 56 and 57, "cutout" should read -- output. --.

Signed and Sealed this

Sixth Day of December, 2005

JON W. DUDAS
*Director of the United States Patent and Trademark Office*